United States Patent
Rius Vazquez et al.

(10) Patent No.: US 7,886,259 B2
(45) Date of Patent: Feb. 8, 2011

(54) METHOD AND CIRCUIT ARRANGEMENT FOR DETERMINING POWER SUPPLY NOISE

(75) Inventors: Josep Rius Vazquez, Barcelona (ES); Jose De Jesus Pineda De Gyvez, Eindhoven (NL)

(73) Assignee: NXP B.V., Eindhoven (NL)

( * ) Notice: Subject to any disclaimer, the term of this patent is extended or adjusted under 35 U.S.C. 154(b) by 1140 days.

(21) Appl. No.: 10/546,395

(22) PCT Filed: Feb. 12, 2004

(86) PCT No.: PCT/IB2004/050107

§ 371 (c)(1),
(2), (4) Date: Aug. 18, 2005

(87) PCT Pub. No.: WO2004/077315

PCT Pub. Date: Sep. 10, 2004

(65) Prior Publication Data

US 2006/0190878 A1    Aug. 24, 2006

(30) Foreign Application Priority Data

Feb. 25, 2003   (EP) .................................. 03100444

(51) Int. Cl.
G06F 9/45    (2006.01)
G06F 17/50   (2006.01)

(52) U.S. Cl. ................... 716/120; 716/115; 716/119

(58) Field of Classification Search ............... 716/6
See application file for complete search history.

(56) References Cited

U.S. PATENT DOCUMENTS

| | | |
|---|---|---|
| 5,444,406 A | 8/1995 | Horne |
| 5,498,972 A | 3/1996 | Haulin |
| 5,521,557 A | 5/1996 | Yamanashita et al. |
| 6,191,647 B1 * | 2/2001 | Tanaka et al. ............... 327/551 |
| 6,570,426 B2 | 5/2003 | Nakashimo |
| 2003/0088395 A1 * | 5/2003 | Frech et al. ................... 703/18 |
| 2005/0165573 A1 * | 7/2005 | Takamiya et al. ........... 702/127 |
| 2005/0285641 A1 * | 12/2005 | Miyata et al. ............... 327/156 |
| 2007/0007970 A1 * | 1/2007 | Neuman ..................... 324/613 |

FOREIGN PATENT DOCUMENTS

CN    1134068 A    10/1996

(Continued)

OTHER PUBLICATIONS

Nagata et al.; "Physical Design Guides for Substrate Noise Reduction in CMOS Digital Circuits"; Mar. 2001; IEEE; All pages.*

(Continued)

*Primary Examiner*—Jack Chiang
*Assistant Examiner*—Suresh Memula

(57) ABSTRACT

The present invention relates to a method and circuit arrangement for determining power supply noise of a power distribution network. The power supply noise is determined by measuring the propagation delay of a delay circuit powered by the power distribution network, wherein the result of the measuring step is used as an indicator of the power supply noise. Thereby, a real-time power supply noise monitoring can be carried out at any point of a power distribution network of an observed circuitry.

16 Claims, 4 Drawing Sheets

FOREIGN PATENT DOCUMENTS

| | | |
|---|---|---|
| CN | 1379427 A | 11/2002 |
| EP | 0 388 767 A2 | 9/1990 |
| EP | 0 771 073 A2 | 5/1997 |
| JP | 2003-302272 * | 8/2003 |

OTHER PUBLICATIONS

Jiang et al.; "Dynamic Timing Analysis Considering Power Supply Noise Effects"; 2000; IEEE; All pages.*

Vazquez et al.; "Power Supply Noise Monitor for Signal Integrity Faults"; Feb. 2004; IEEE; All pages.*

Metra et al.; "Self-Checking Detection and Diagnosis of Transient, Delay, and Crosstalk Faults Affecting Bus Lines"; Jun. 2000; IEEE; All pages.*

Sakurai, et al. "Alpha-Power Law MOSFET Model and its Applications to CMOS Inverter Delay and Other Formulas," IEEE J. of Solid-State Circuits, vol. 25, No. 2, pp. 584-594 (Apr. 1990).

Zhao, S. et al. "Estimation of Switching Noise on Power Supply Lines in Deep Sub-Micron CMOS Circuits," 13th Int'l. Conf. on VLSI Design 2000, pp. 168-173 (Jan. 3, 2000).

Aoki, et al. "On-Chip Voltage Noise Monitor for Measuring Voltage Bounce in Power Supply Lines Using a Digital Tester," Proc. of the 2000 Int'l. Conf. on Microelectronic Test Structures, pp. 112-117 (2000).

Metra, et al. "Self-Checking Scheme for the On-Line Testing of Power Supply Noise," Proc. of the 2002 Design, Automation and Test in Europe Conf. and Exhibition, 5 pgs. (2002).

Liau, E. et al. Automatic Worst Case Pattern Generation Using Neural Networks & Genetic Algorithm for Estimation of Switching Noise on Power Supply Lines in CMOS Circuits), Proc. of the 8th IEEE European Test Workshop, pp. 105-110 (May 25, 2003).

International Search Report for International Patent Appln. No. PCT/IB2004/050107 (Jul. 13, 2004).

International Preliminary Report on Patentability for International Patent Appln. No. PCT/IB2004/050107 (Aug. 26, 2005).

* cited by examiner

METHOD AND CIRCUIT ARRANGEMENT FOR DETERMINING POWER SUPPLY NOISE

RELATED PATENT DOCUMENTS

This is the national stage filing under 35 U.S.C. §371 of International Application No. PCT/IB2004/050107 filed on Feb. 12, 2004; which claims foreign priority benefit under 35 U.S.C. §119 of European Application No. 03100444.3 filed on Feb. 25, 2003.

The present invention relates to a method and circuit arrangement for determining power supply noise of a power distribution network, in particular a circuit arrangement provided on an integrated circuit comprising the power distribution network.

Especially in high-speed digital integrated circuits (ICs) the problem of power supply noise (PSN) is faced. Due to their complexity, integration density and speed of operation such modern ICs suffer from signal crosstalk between connection lines. PSN corresponds to variations of the power supply voltage or ground potential caused by the circuit switching activity. The increase in complexity and in integration density leads to an increased electrical interaction between wires of the connection lines distributing supply voltages and active circuits. As a consequence, current spikes produced during switching activities are transformed into voltage bounces or variations in the supply lines. This causes transient reductions in the supply voltage and thus decreases the gate drive strength, which leads to an increased gate delay and a lowered circuit performance. This problem is even worse at higher clock frequencies and lower supply voltages used in current and future technologies.

PSN is usually managed by a combination of techniques for PSN reduction, e.g. by including on-chip decoupling capacitors or sizing of power supply and ground distribution wires. Moreover, isolation of more sensitive circuits from noisy circuits is a well-known technique. As an example, document EP 0 771 073 A2 discloses a method and apparatus for controlling ground potential variations, i.e. ground bounce, in integrated circuits. Two separate techniques are used simultaneously to diminish the problem of such ground bounce. First, an impedance is placed between a power source distribution line system, i.e. power source bus, on the integrated circuit and an external power source; and between a ground bus on the chip and an external ground. This effectively dampens ground bounce oscillations in the power and ground leads of the chip. Second, capacitance is dynamically added to the pre-drive of an output buffer with a capacitance node. However, according to S. Zhao et al, "Estimation of Switching Noise on Power Supply Lines in Deep Sub-Micron CMOS Circuits", Proceedings of $13^{th}$ International Conference on VLSI Design, Jan. 2000, pp. 168-173, PSN is still a major problem for high-speed systems. Estimation of the worst case switching noise is essential to ensure proper functionality of VLSI (Very Large Scale Integration) circuits. For this reason, on-line monitoring of PSN is an interesting possibility in order to obtain information on the presence of excessive PSN so as to allow a system controller to take actions for correction. Such monitoring should be arranged to allow a location anywhere in the circuit to check the PSN in the local power or ground lines to which the monitoring circuit is connected. Furthermore, the monitoring circuit should be able to check PSN at any given time with a high time resolution and must be sensitive to PSN on supply and ground lines, while the monitoring operations must not be affected by the monitored PSN.

It is therefore an object of the present invention to provide an improved PSN determination scheme by means of which a flexible real-time PSN monitoring is possible.

This object is achieved by a circuit arrangement as claimed in claim 1 and by a PSN determination method as claimed in claim 15.

Accordingly, PSN is measured through its effect on the propagation delay of a delay circuit. Thereby, real-time monitoring of PSN is allowed anywhere within a power distribution network of e.g. an IC. PSN is indirectly measured by means of its effect upon the propagation delay of a dedicated monitoring circuit. The propagation delay is directly dependent upon the supply voltage of the delay circuit, including any and all variations, such as PSN. The less the supply voltage, the greater is the propagation delay and vice versa. Therefore, any variation in the supply voltage due to PSN will be detected, so as to take into account any detrimental effects caused by PSN. This proposed solution allows real-time PSN monitoring, fine grain PSN monitoring, more sensitive and accurate PSN monitoring anywhere within the power distribution network, e.g. on the IC. Furthermore, a plurality of monitoring circuits can be used simultaneously.

The delay measuring means may comprise a switching means for connecting a current supply to a capacitor, the switching means being controlled by the input signal and the output signal of the measuring means. In particular, the switching means may be controlled by the input and output signals to enable a charging process of the capacitor during the time delay, the output signal being derived from the charge voltage of the capacitor. Thus, a sample and hold measurement technique can be provided, wherein the analog output signal of the sample and hold circuitry, which could be digitized, can then be used to operatively control the concerned signal processing circuit, e.g. the IC, or a part thereof, so as to initiate counter actions.

The switching means of the above sample and hold circuitry may comprise a first switch controlled by the input signal and a second switch controlled by the output signal. In this case, the first and second switches may be arranged in a series connection between the current supply and the capacitor. Specifically, the first and second switches may comprise transistor switches. Thereby, the whole sample and hold circuitry can be implemented based on a semiconductor circuitry with a capacitor, which allows efficient integration on an IC.

The measuring means may comprise a buffer circuit for isolating the current supply from the power distribution network. This buffer circuit may comprise switching means and capacitor means, wherein the switching means may be controlled by the input signal so as to temporarily connect the capacitor means to a supply line of the power distribution network. This implementation again simplifies the provision of the buffer circuit as an integrated circuit, and provides an isolation of the measuring process from the PSN.

Additionally, triggering means may be provided for supplying the input signal to the delay measuring means at a predetermined timing with respect to a clock signal. The triggering means may comprise a plurality of delay lines for delaying the clock signal and selection means for selecting an output of one of the delay lines in response to a selection signal. Such a trigger circuitry provides a mechanism to change the sampling time by means of which the PSN can be sampled at a given time, e.g. when the maximum PSN is produced. By changing the selection, different delays between the global clock signal and the input signal of the measuring means can be generated to search for the maximum PSN detection value.

The delay circuit may be arranged to delay the input signal by a delay time which is at least ten times smaller than a characteristic time of a waveform of the power supply noise. This allows a proper sampling, since the sampling period of the PSN monitoring process is much smaller then the duration of the PSN. The PSN behavior will thus be collected with enough accuracy.

Furthermore, an output processing circuit can be provided for processing the output signal to detect an excessive power supply noise. This may be achieved by a comparator for comparing the output signal with a predetermined threshold. This output processing provides the advantage that a convenient digital output is generated which reports if PSN is too high.

The measuring step may either be performed at one point of the power distribution network or at multiple points of the power distribution network. Furthermore, the measuring step may be performed in one or a plurality of predetermined clock cycles or in each clock cycle of a synchronous integrated circuit comprising the power distribution network.

Further advantageous modifications are described in the dependent claims.

The present invention will now be described in greater detail based on a preferred embodiment with reference to the drawings, in which FIG. 1 shows a schematic diagram of a PSN measuring scheme according to the present invention, and corresponding waveforms;

The preferred embodiment of the present invention will now be described on the basis of a monitoring circuit for real-time monitoring of PSN of a digital circuit. The monitoring strategy comprises measuring the PSN by its effect on the delay of the monitoring circuitry. The monitoring circuit transforms the variable delay into a variable voltage which can be compared with a threshold or converted later into digital data. The monitoring circuit may thus be used for on-line testing of excessive PSN or as a monitoring part in any scheme that changes the operation circuit parameters to put the circuit within required PSN specifications.

Figure 1A:
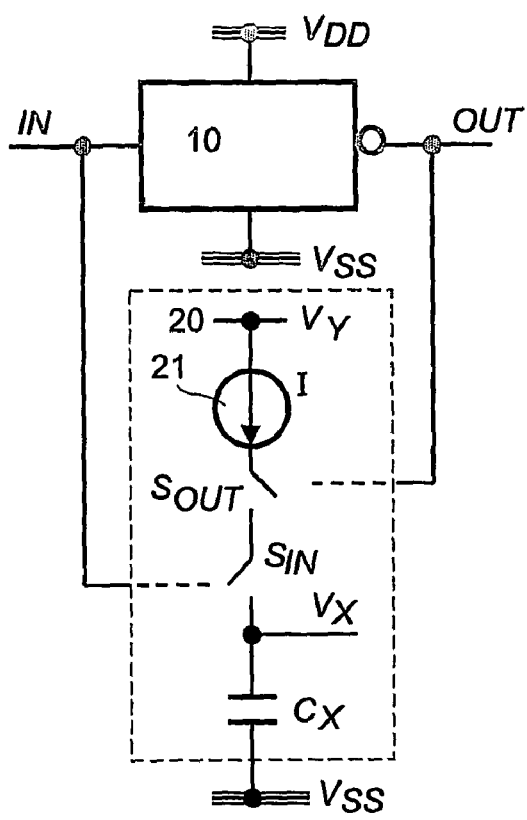

FIG. 1(a) shows a schematic block diagram indicating an overview of the proposed PSN monitoring circuit according to preferred embodiment. The PSN monitoring circuit comprises a delay block or circuit 10 and a delay measuring circuit 20 which measures the propagation delay between an input terminal and an output terminal of the delay circuit 10. The delay circuit 10 is connected to a power line $V_{DD}$ and a ground line $V_{SS}$ of a power distribution network of the digital circuit whose PSN is to be measured. The measuring circuit 20 has its own power supply line $V_Y$ which can be isolated or decoupled from the power distribution network.

In the preferred embodiment, the delay circuit 10 works as a delay line whose delay value depends on its effective supply voltage. In synchronous systems, the circuit activity and thus also the PSN is triggered by a clock signal used in the digital circuit.

Accordingly, the input terminal of the delay circuit 10 is supplied with an input signal IN derived from the clock line of the digital circuit. At the output terminal, an output signal OUT is obtained at a delay depending on the propagation delay of the delay circuit 10.

The measuring circuit 20 comprises switches $S_{IN}$ and $S_{OUT}$ which are connected in series between a current source 22 and a capacitor CX. When the input signal IN is at low level or "0" the switch $S_{IN}$ which is controlled by the value of the input signal IN is open, while the switch $S_{OUT}$ which is controlled by the output signal OUT is closed when the output signal OUT is at low level or "0". In this initial situation, the capacitor $C_X$ is discharged and the voltage $V_X$ at the capacitor $C_X$ is zero. The rising edge of the clock signal produces also a rising edge of the input signal IN and the switch $S_{IN}$ is closed such that a charge current I begins to flow into the capacitor $C_X$, thereby increasing the Voltage $V_X$. The charge current I charges the capacitor $C_X$ until the output signal OUT of the delay circuit 10 changes to high level or "1" and opens the switch $S_{OUT}$. Hence, the total charge supplied to the capacitor $C_X$ is substantially proportional to the propagation delay of the delay circuit 10. As the propagation delay depends on the effective supply voltage seen by the delay circuit 10, the voltage $V_X$ at the end of the described sampling period depends also on the supply voltage. As the power bounce and ground bounce is produced just after the clock edge, the voltage $V_X$ will be dependent on this power and ground bounce, i.e. the stronger the bounce or variation is, the longer will be the propagation delay and the higher will be the voltage $V_X$.

Figure 1B:
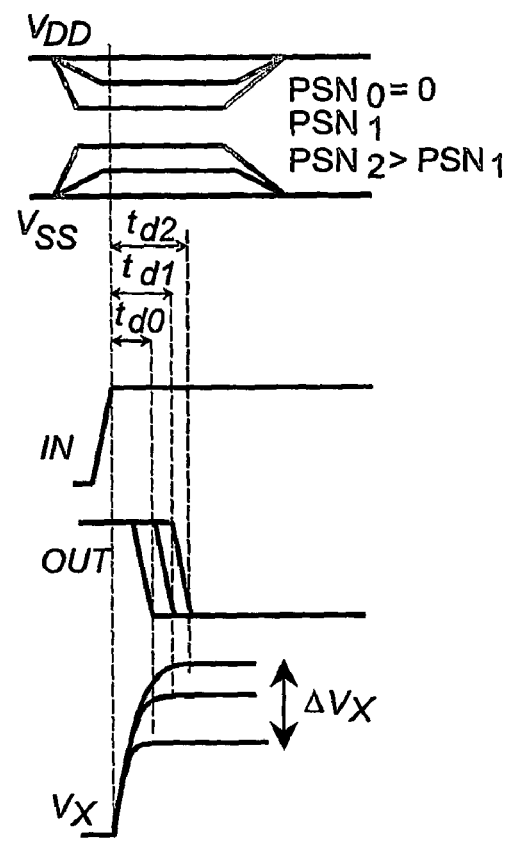

FIG. 1(b) shows signaling diagrams with respective waveforms of the supply voltage $V_{DD}$, the ground potential $V_{SS}$, the input signal IN, the output signal OUT and the capacitor voltage $V_X$. When the PSN is zero, the smallest propagation delay $t_{d0}$ and the smallest capacitor voltage $V_X$ is observed. At an intermediate PSN value PSN1, an intermediate propagation delay $t_{d1}$ and an intermediate capacitor voltage $V_X$ is obtained, while at a higher PSN value PSN2, a higher propagation delay $t_{d2}$ and a higher capacitor voltage $V_X$ is obtained. In this way, the capacitor voltage $V_X$ is a sample of the effective supply voltage at the point where the delay circuit 10 of the monitoring circuit is connected. It is noted that in the present example shown in FIG. 1(b) the PSN is generated by a power line bounce and a simultaneous ground line bounce which both lead to a decrease of the effective supply voltage at the delay circuit 10. The highest PSN value PSN2 leads to the indicated change $\Delta V_X$ of the capacitor voltage $V_X$.

The sampling time corresponds to the moment when the rising edge is produced in the input signal IN which is closely related to the rising edge of the general clock signal of the overall digital circuit. By changing this sampling time, samples of the capacitor voltage $V_X$ can be obtained at different times to thereby check the PSN in the whole clock cycle.

It is well known that the waveforms of the supply voltage and ground potential are very complex because multiple current spikes of different sizes are observed in and after the clock edge along the whole digital circuit. Moreover, the power and ground lines work as a distributed RLC network and the non-active gates of digital circuit work as a network of lossy capacitors. The current spikes generated on the supply and ground waveforms excite this complex mesh of distributed elements generating complex waveforms that evolve in time and space. The exact waveforms depend on the current distribution, the RLC parameters and the layout of the digital circuit, thus being in general different in each clock period. To deal with this diversity, the PSN monitoring circuit needs to have a time resolution adapted to the PSN waveform, To work properly, a sampling period of the PSN monitoring circuit, i.e. the delay of the delay circuit 10 in FIG. 1(a) should be much smaller than the duration of the PSN waveforms. If the characteristic time of the PSN waveform is higher than about ten times the sample period of the PSN monitoring circuit, it will collect the PSN behavior with enough accuracy. The characteristic time of the PSN waveform can be estimated as a characteristic time by knowing the logic deep of the digital circuit, which can be in the range of 20 to 30. Further information regarding the estimation of the characteristic time of the PSN waveform are described in H. Bakoglu, "Circuits, Interconnections and Packaging for VLSI", Reading, MA Addisson-Wesley, 1990. If the PSN monitoring circuit has a sampling period equivalent to a range from about two to three gate delays, it will be able to capture the interesting features of the PSN waveform. This is the case in the proposed PSN monitoring circuit, such that it can be assumed without great error that the power supply voltage VDD can be regarded constant during the propagation of the input signal IN from the input terminal to the output terminal of the delay circuit 10.

Figure 2A:
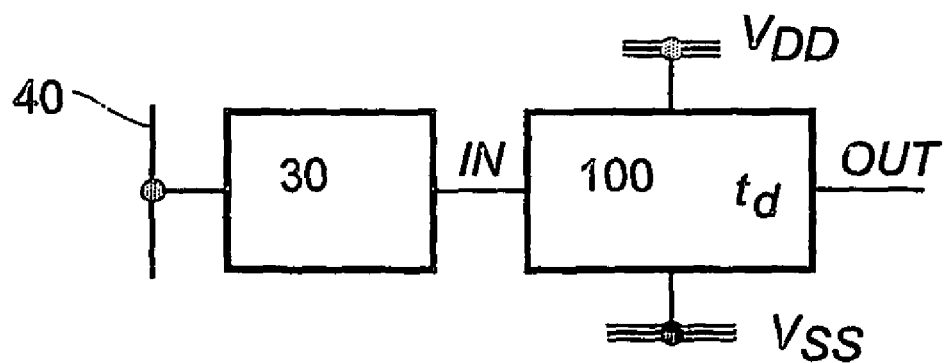
FIG. 2 shows a schematic block diagram of a PSN monitoring circuit with a preceding trigger circuit according to the present invention with corresponding waveforms.
Figure 2B:
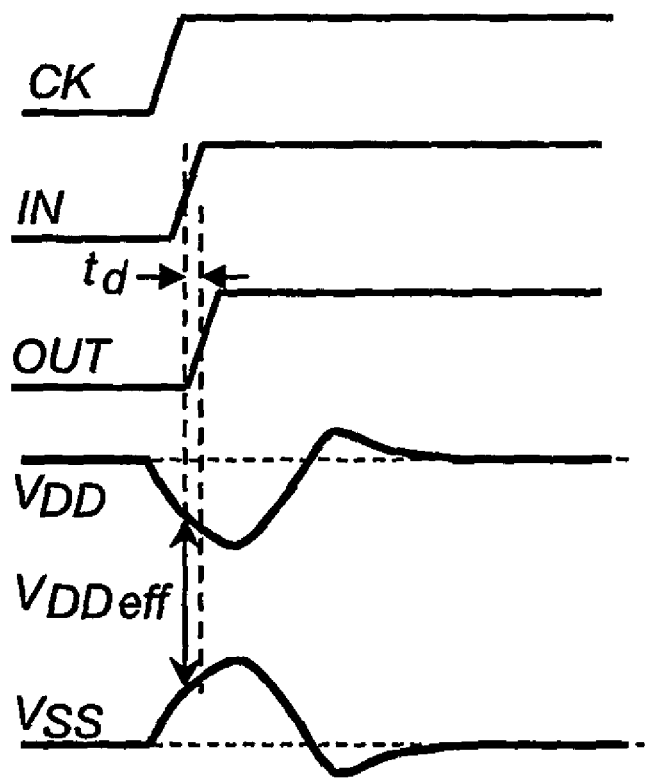

FIG. 2(a) shows a block diagram of a circuit arrangement comprising a monitoring circuit 100 as shown in FIG. 1 and a preceding trigger circuit 30 for adjusting the timing of the input signal IN. As indicated in FIG. 2, the trigger circuit 30 is connected with its input terminal to a clock line 40 which supplies the clock signal CK, from which the input signal IN is derived. FIG. 2(b) shows waveforms of the clock signal CK, the input signal IN of the monitoring circuit 100 and its output signal OUT, the supply voltage $V_{DD}$ and the ground potential $V_{SS}$. The dotted lines in FIG. 2(b) indicate the start time and stop time of the sampling period, i.e. the propagation delay $t_d$. If the propagation delay $t_d$ is selected small enough, the effective supply voltage $V_{DDeff}$ seen by the delay circuit 10 can be regarded constant.

Figure 3:
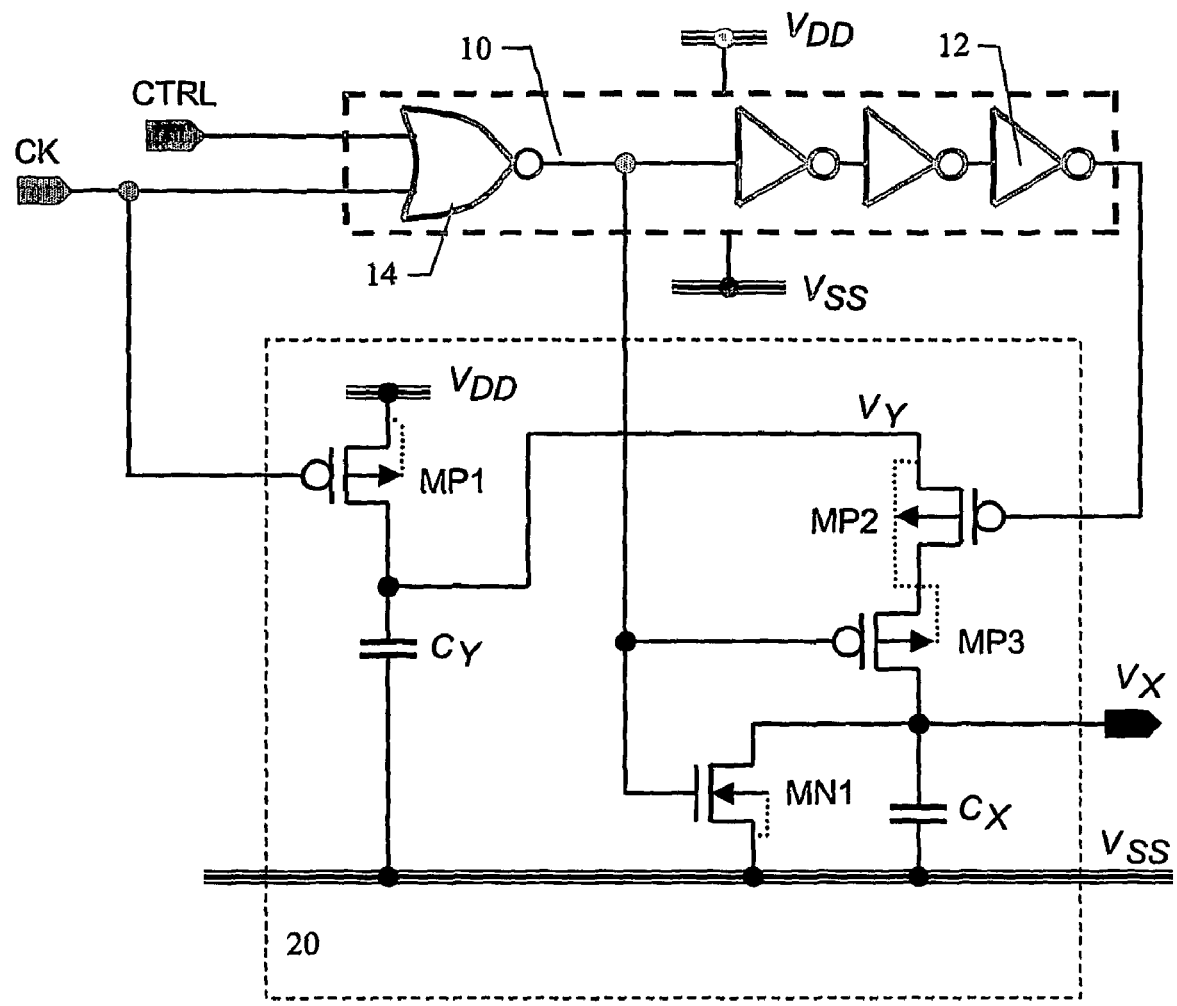
FIG. 3 shows a schematic circuit diagram of a PSN monitoring circuit according to the preferred embodiment.

FIG. 3 shows a schematic circuit diagram of a PSN monitoring circuit according to the preferred embodiment. In FIG. 3, the delay circuit 10 consists of three inverter circuits 12 to which an input signal is supplied via a NOR gate 14 which works as a control gate to disconnect or test the monitoring circuit when desired. Thus, the supply of a clock signal CK to the inverter delay line can be controlled by the logical level applied to a control signal CTRL at the other input of the NOR gate 14. Additionally the clock signal CK is supplied to an inverted gate terminal of a CMOS transistor MP1 which provides a connection between the power supply line $V_{DD}$ and a buffer capacitor $C_Y$ from which the charging current for the PSN measuring capacitor $C_X$ is supplied. Thus, the transistor MP1 works as a switch which connects and disconnects the buffer capacitor $C_Y$ form the power supplied line $V_{DD}$. The buffer capacitor $C_Y$ must be selected large enough to keep its voltage $V_Y$ substantially constant during the sampling process, thus isolating the current supplied to the measuring capacitor $C_X$ from the influence of power supply variations due to the PSN. The serial CMOS transistors MP2 and MP3 correspond to the switches $S_{IN}$ and $S_{OUT}$ in FIG. 1(a) and determine the charging time of the measuring capacitor $C_X$. As indicated in the circuit diagram of FIG. 3, the CMOS transistors MP1 to MP3 are p-channel CMOS transistors.

Furthermore, an n-channel CMOS transistor MN1 is connected in parallel to the measuring capacitor $C_X$ and is controlled by the input signal IN of the inverter delay line, so as to discharge the measuring capacitor $C_X$ while the input signal IN is at low level or "0". Thereby, an initial reset of the measuring voltage $V_X$ can be assured.

The PSN monitoring circuit of FIG. 3 operates as follows. A clock signal CK supplied to the NOR gate 14 closes the CMOS transistor MP1 with its low level state to charge the buffer capacitor $C_Y$ to the power supply voltage $V_{DD}$. If the control signal CTRL is at low level, a change of the clock signal CK is transferred to the input of the inverter delay line and sets the input signal IN to a low level which opens the n-channel transistor MN1 and closes the p-channel transistor MP3 to thereby start a charging process of the measuring capacitor $C_X$. This charging process goes on until the falling edge of the input signal has reached the output of the inverter delay line as a rising edge which closes the upper p-channel transistor MP2 and stops the charging process. The voltage $V_X$ generated at the measuring capacitor $C_X$ then corresponds to the propagation delay of the inverter delay line, which in turn corresponds to the power supply voltage $V_{DD}$ at the sampling time. The PSN reduces the effective supply voltage applied to the gates of the transistor elements of the inverter delay line and consequently leads to an increased propagation delay.

Figure 4:
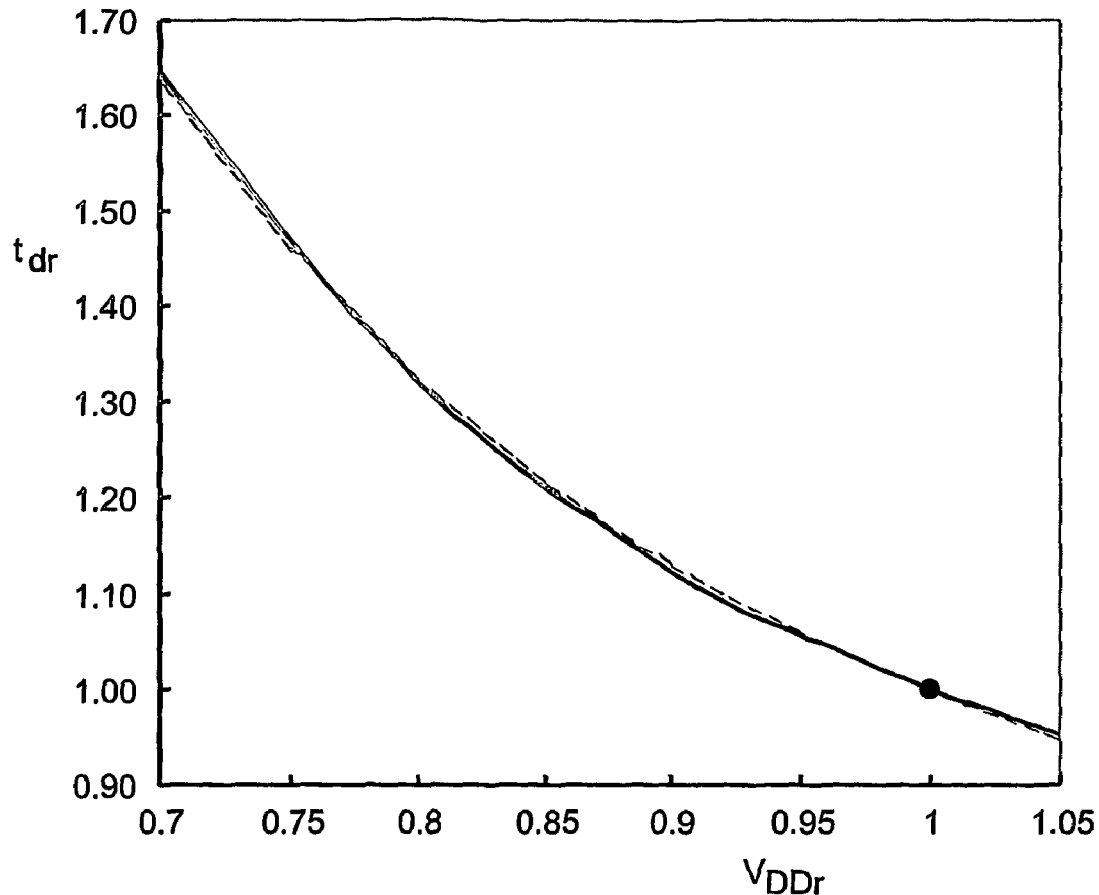
FIG. 4 shows a diagram indicating the relationship between a supply voltage and a gate propagation delay.

The solid line in FIG. 4 shows indicates the relationship between the supply voltage $V_{DD}$ and the propagation delay $t_d$ as relative values $V_{DDr}$ and $t_{ddr}$ for the disclosed chain of three inverters 12.

This relationship can be expressed by the following equation (1) as defined in Takayasu Sakurai, αPower Law MOSFET Model and its Applications to CMOS Inverter Delay and Other Formulas", IEEE Journal of Solid State Circuits, April 1990 pp. 584-593:

$$t_d = K \frac{V_{DD}}{(V_{DD} - V_{TH})^\alpha} \quad (1)$$

where K designates a constant of proportionality, $V_{TH}$ designates the transistor threshold voltage, and α designates a parameter modeling velocity saturation and second order effects. A simulation of the three inverter delay line has led to exemplary values $K=1.92\times10^{-11}$ and $\alpha=1.37$ as the best fit. In FIG. 4, the dashed line follows equation (1) and the solid line has been obtained from a simulation.

Taking the derivative of the propagation delay $t_d$ with respect to the power supply voltage $V_{DD}$, the following expression (2) can be obtained:

$$\frac{dt_d/t_d}{dV_{DD}/V_{DD}} = \left(1 - \frac{\alpha V_{DD}}{V_{DD} - V_{TH}}\right) < 0 \quad (2)$$

For the above value of α, and the nominal value of the threshold voltage $V_{TH}$, and around the nominal power supply voltage $V_{DD}$, this expression is closed to "−1". This means, that for instance, a 5% decrease in the supply voltage $V_{DD}$ implies a 5% increase in the propagation delay, which means that the slope of the curve shown in FIG. 4 is practically constant around the nominal value of the supply voltage $V_{DD}$. However, if the reduction in the supply voltage $V_{DD}$ is more severe, the slope increases and linear dependence between the changes in supply voltage $V_{DD}$ and the changes in the propagation delay is no longer valid.

On the other hand, the capacitor voltage $V_X$ follows in a first order approximation the following expression:

$$V_x = \frac{I_0 t_d}{C_X} \quad (3)$$

Wherein $I_0$ notes the averaged value of the current I supplied by the switching transistors MP2 and MP3 during the charging period of the capacitor $C_X$. This averaged current is independent of the changes in the capacitor voltage $V_X$ as long as they are small enough.

By substituting equation (1) in equation (3) and taking the derivative with respect to the power supply voltage $V_{DD}$ the following expression (4) is obtained:

$$\frac{dV_X/V_X}{dV_{DD}/V_{DD}} = \left(1 - \frac{\alpha V_{DD}}{V_{DD} - V_{TH}}\right) = \frac{dt_d/t_d}{dV_{DD}/V_{DD}} \quad (4)$$

Which is the same expression as equation (2). This means that for small enough dips or drops in the supply voltage $V_{DD}$ the change in the capacitor voltage $V_X$ will be proportional to the change in the power supply voltage $V_{DD}$.

The monitoring circuit 100 described above samples the PSN at a given time. However, the exact timing at which the maximum PSN is produced is not known in advance. For this reasons a mechanism to change the sampling time is needed.

Figure 5:
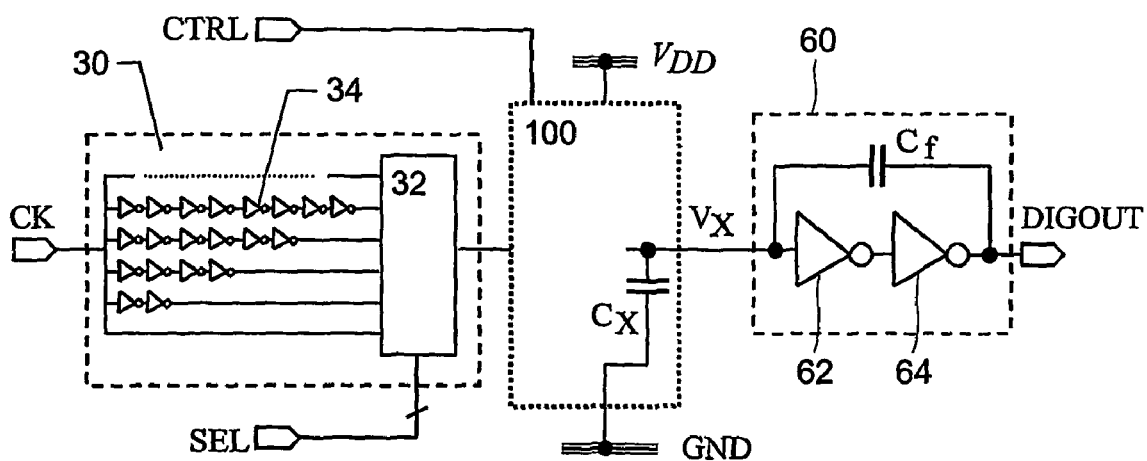
FIG. 5 shows a PSN monitoring circuit with a preceding adjustable trigger circuit and an output processing circuit according to the preferred embodiment.

FIG. 5 shows a schematic block diagram indicating the PSN monitoring circuit 100 with the preceding triggering circuit 30 and additional output processing circuit 60. In FIG. 5, a specific example of the trigger circuit 30 is shown, where a plurality of inverter-based delay lines 34 generate different delays between the global clock signal CK and a local clock applied to the PSN monitoring circuit 100. A control or selection signal SEL which can be supplied by a high level controller may be used to select one of the delay lines 34 to investigate the PSN at a given time. The selection of the local clock signals with different delays can be preformed by a multiplexing circuit 32 which is controlled by the selection signal SEL. Thus, the timing of the edge of the local control signal supplied to the PSN monitoring circuit 100 can be shifted based on the selection of the delay lines 34 to a predetermined timing at which a maximum PSN occurs.

The output of the PSN monitoring circuit 100 corresponds to the analog voltage $V_X$ at the capacitor $C_X$. In a signal integrity environment it is convenient to obtain a digital output which reports an excessive PSN, i.e. whether the measured PSN is too high. For this reason, a type of analog to digital conversion is required. Due to the fact that the voltage $V_X$ is stored in the capacitor $C_X$, the acquisition time and the processing time in the output processing circuit 60 can be decoupled.

If it is required to measure the voltage dip or drop in the supply lines at every clock cycle, then a simple and very fast comparison is needed at the output processing circuit 60. This can be achieved by providing a fast comparator 62 which compares the output voltage $V_X$ with a predetermined output threshold value to obtain a pass or fail signal. In this case, the control signal CTRL must be always at "0" to enable the PSN measuring process at the monitoring circuit 100.

If the time requirements are not so strict, the PSN monitoring can be preformed only in a given or predetermined clock cycle determined by an activation of the control signal CTRL only during the targeted or desired clock cycle, and keep it at high level or "1" afterwards.

In this case, the voltage $V_X$ is stored during a relatively long time period in the capacitor $C_X$ and can be processed by a more elaborated and slower but accurate analog-to-digital converter or comparator 62 in the output processing circuit 60. The output threshold value used by the comparator 62 can be set individually based on the requirements for excessive PSN.

Additionally the output processing circuit 60 comprises a second inverter 64 which is used to reinforce the isolation of the voltage $V_X$ from the digital output, and to provide a positive feedback to the first inverter or comparator 62 in order to avoid the undesirable backward Miller effect produced when the voltage $V_X$ is very near to the comparator threshold. The positive feedback also increases the speed of the comparator 62. Thus, a feeding capacitor $C_f$ may be provided between the analog input and the digital output of the output processing circuit 60.

In an exemplary implementation of the circuit diagram of FIG. 3, the width of the CMOS transistor has been set to 1 μm, the width of the serial transistors MP2 and MP3 have been set to 0.35 μm, and the n-channel transistor MN1 has been selected with a width of 0.12 μm. Furthermore, the value of the measuring capacitor $C_X$ may be set to 3.7 fF if the comparator 62 is used, while the value may be set to 5 fF if no comparator 62 is used. The buffer capacitor $C_Y$ may have a capacitance of 1 pF. Finally the feeding capacitor $C_f$ may have a capacity of 0.5 fF. It is to be noted that the above figures are only indicated as exemplary figures for a specific integrated circuit and may vary within wide ranges based on the specific application. For the above specific circuit parameters, the sampling period of the PSN monitoring circuit 100 could be set to about 100 ps.

In summary, the described PSN monitoring circuit 100 is suitable for deep sub-micron technologies and can be located anywhere in the circuit to check the PSN in local power and/or ground lines to which the monitoring circuit is connected. Furthermore, it can be designed as a standard cell for integration purposes. The time resolution can be set high enough to collect the main features of PSN in modern circuits in supply as well as ground lines. The output of the monitoring circuit 100 can be isolated from the PSN, because it uses a locally generated and isolated power supply. The output signal is based on a charge of the capacitor $C_X$ which allows to decouple the sampling time from the processing time of the output. A high-level controller can easily change the sampling time by providing a corresponding controllable trigger circuit. Furthermore, the control input for the control signal CTRL allows the selection of a desired clock circle for PSN measurement. As the monitoring circuit 100 is able to detect on-line the presence of excessive PSN, it can be used in any PSN control scheme to change the operating circuit parameters based on the monitoring output and thereby put the circuit in the PSN specifications.

It is noted that the present invention is not limited to the above preferred embodiment but can be modified in various ways. For example the arrangement and implementation of the switches $S_{IN}$ and $S_{OUT}$ in FIG. 1(a) may be varied in obvious ways to obtain the desired loading of the capacitor $C_X$ during the propagation delay. Any kind of controllable semiconductor switch or other controllable switches may be used. The same applies to the other switching transistors MP1 and MN1. The trigger circuit 30 in FIG. 5 may be replaced by digital delay circuit based on a counter circuit, timer circuits, flip flop circuits and/or monostable circuits. The same applies to the delay circuit 10, provided that the alternative digital circuit also provides a propagation delay depending on the supply voltage $V_{DD}$. Accordingly the preferred embodiment may vary within the scope of the attached claims.

The invention claimed is:

1. A circuit arrangement for determining power supply noise of a power distribution network, said circuit arrangement comprising:
   a delay circuit connected to at least one supply line of said power distribution network;
   a delay measuring circuit for measuring a time delay between an input signal supplied to said delay circuit and an output signal obtained at the output of said delay circuit in response to said input signal, wherein said delay measuring circuit comprises a switching circuit for connecting a current supply to a capacitor, said switching circuit being controlled by said input signal and said output signal; and an output circuit for outputting a signal corresponding to said measured time delay.

2. A circuit arrangement according to claim 1, wherein said switching circuit is controlled by said input and output signals to enable a charging process of said capacitor during said time delay, said output signal being derived from the charge voltage of said capacitor.

3. A circuit arrangement according to claim 1, wherein said switching circuit comprises a first switch controlled by said input signal and a second switch controlled by said output signal.

4. A circuit arrangement according to claim 3, wherein said first and second switches are arranged in a series connection between said current supply and said capacitor.

5. A circuit arrangement according to claim 3, wherein said first and second switches comprises transistor switches.

6. A circuit arrangement according to claim 1, wherein said measuring circuit comprises a buffer circuit for isolating said current supply from said power distribution network.

7. A circuit arrangement according to claim 6, wherein said buffer circuit comprises switching circuit and a capacitor circuit, wherein said switching circuit is controlled by said input signal so as to temporarily connect said capacitor circuit to a supply line of said power distribution network.

8. A circuit arrangement according to claim 1, further comprising a triggering circuit for supplying said input signal to said delay measuring circuit at a predetermined timing with respect to a clock signal.

9. A circuit arrangement according to claim 8, wherein said triggering circuit comprises a plurality of delay lines for delaying said clock signal and selection circuitry for selecting an output of one of said delay lines in response to a selection signal.

10. A circuit arrangement according to claim 1, wherein said delay circuit is arranged to delay said input signal by a delay time which is at least ten times lower than a characteristic time of a waveform of said power supply noise.

11. A circuit arrangement according to claim 1, further comprising an output processing circuit for processing said output signal to detect an excessive power supply noise.

12. A circuit arrangement according to claim 11, wherein said output processing circuit possesses a comparator for comparing said output signal with a predetermined threshold.

13. A circuit arrangement according to claim 1, wherein said circuit arrangement is monolithically arranged on an integrated circuit comprising said power distribution network.

14. A circuit arrangement for determining power supply noise of a power distribution network for a digital circuit, the circuit arrangement comprising:

a delay circuit connected to at least one supply line of the power distribution network; and a delay measuring circuit to measure a time delay between an input signal supplied to the delay circuit and an output signal obtained at the output of the delay circuit in response to said input signal, and output a signal corresponding to the measured time delay to characterize the power supply noise of the power distribution network, wherein the delay measuring circuit includes a capacitor that is loaded during a propagation delay in the delay circuit, and outputs a signal corresponding to the measured time delay by outputting a signal corresponding to the charge of the capacitor.

15. The circuit arrangement of claim 14, wherein the delay measuring circuit includes a switch circuit to connect the at least one supply line to the capacitor in response to a clock signal of the digital circuit.

16. A circuit arrangement for determining power supply noise of a power distribution network for a digital circuit, the circuit arrangement comprising:

a delay circuit connected to at least one supply line of the power distribution network; and a delay measuring circuit to measure a time delay between an input signal supplied to the delay circuit and an output signal obtained at the output of the delay circuit in response to said input signal, and output a signal corresponding to the measured time delay to characterize the power supply noise of the power distribution network, wherein the delay measuring circuit includes a capacitor that is loaded during a propagation delay in the delay circuit, and outputs a signal corresponding to the measured time delay by outputting a signal corresponding to the charge of the capacitor, and a switch circuit, including an input switch that connects the capacitor to the at least one power supply line and an output switch that connects the capacitor to an output for outputting said signal, where in an initial state when an input clock signal is at low level, the input switch is open and the output switch is closed to discharge the capacitor, in response to a rising edge of the clock signal, the input switch closes and charges the capacitor, in response to the output signal of the delay circuit reaching a high level, the output switch opens.

* * * * *